(12) United States Patent
Yabe

(10) Patent No.: US 6,572,285 B2
(45) Date of Patent: Jun. 3, 2003

(54) PHOTORESIST DEVELOPING NOZZLE, PHOTORESIST DEVELOPING APPARATUS, AND PHOTORESIST DEVELOPING METHOD

(75) Inventor: Sachiko Yabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/816,366

(22) Filed: Mar. 26, 2001

(65) Prior Publication Data

US 2002/0043541 A1 Apr. 18, 2002

(30) Foreign Application Priority Data

Oct. 12, 2000 (JP) .......................... 2000-311543

(51) Int. Cl.⁷ ................................ G03D 5/00
(52) U.S. Cl. ............ 396/604; 396/611; 396/627; 118/52; 427/240
(58) Field of Search ............. 396/604, 611, 396/627; 118/52, 319–321, 721–726

(56) References Cited

U.S. PATENT DOCUMENTS 5,127,362 A * 7/1992 Iwatsu et al. ............... 118/52
5,695,721 A * 12/1997 Kitagawa et al. ........... 422/99
6,190,063 B1 * 2/2001 Akimoto ...................... 396/611
6,209,757 B1 * 4/2001 Dumont ..................... 222/145.6
6,238,107 B1 * 5/2001 Inada ......................... 396/611
6,322,849 B2 * 11/2001 Joshi et al. ................ 427/126.3

FOREIGN PATENT DOCUMENTS

| JP | 01-220826 | * | 9/1989 |
| JP | 2000-51683 | * | 2/2000 |
| JP | 2000-294132 | * | 10/2000 |

* cited by examiner

Primary Examiner—D. Rutledge
(74) Attorney, Agent, or Firm—Volentine Francos, PLLC

(57) ABSTRACT

A photoresist developing nozzle, a photoresist developing apparatus and a photoresist developing method capable of effecting uniform development are provided even in the case of a large diameter wafer. A photoresist nozzle has a plurality of small chambers, developer supply flow passages for supplying developer to respective small chambers, and developer discharge sections for discharging developer supplied from the developer supply flow passages onto the wafer. The photoresist developing apparatus has the photoresist developing nozzle and the photoresist developing method uses the photoresist developing nozzle.

12 Claims, 10 Drawing Sheets

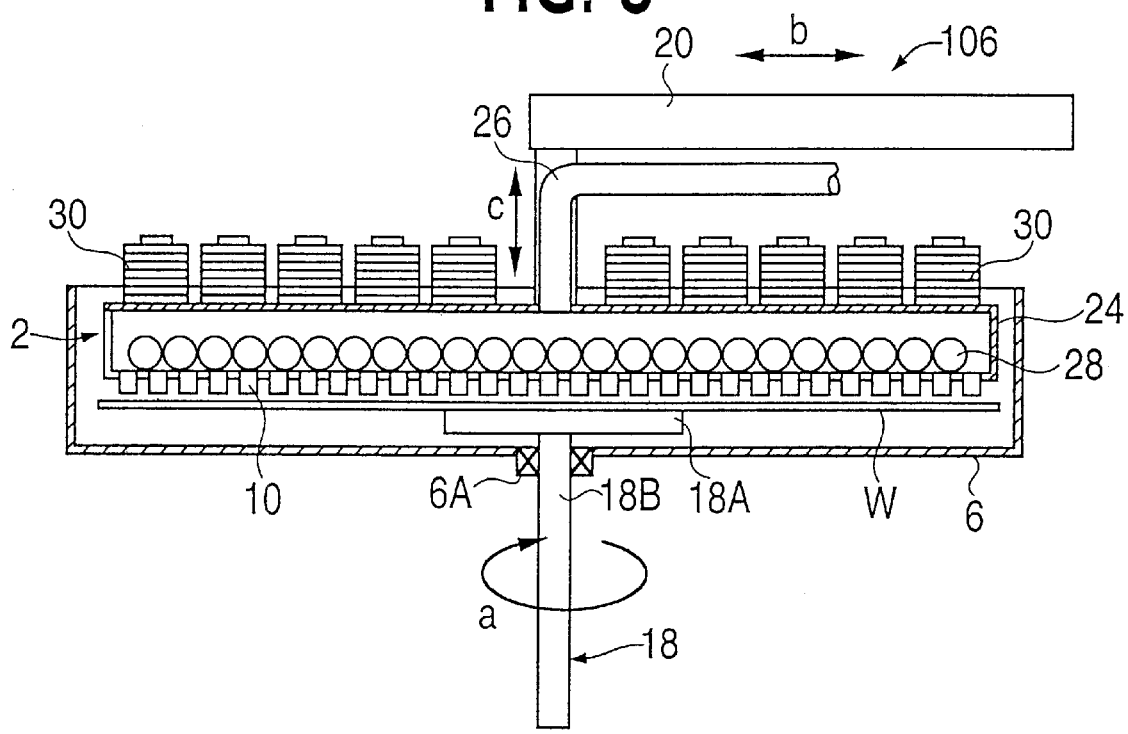
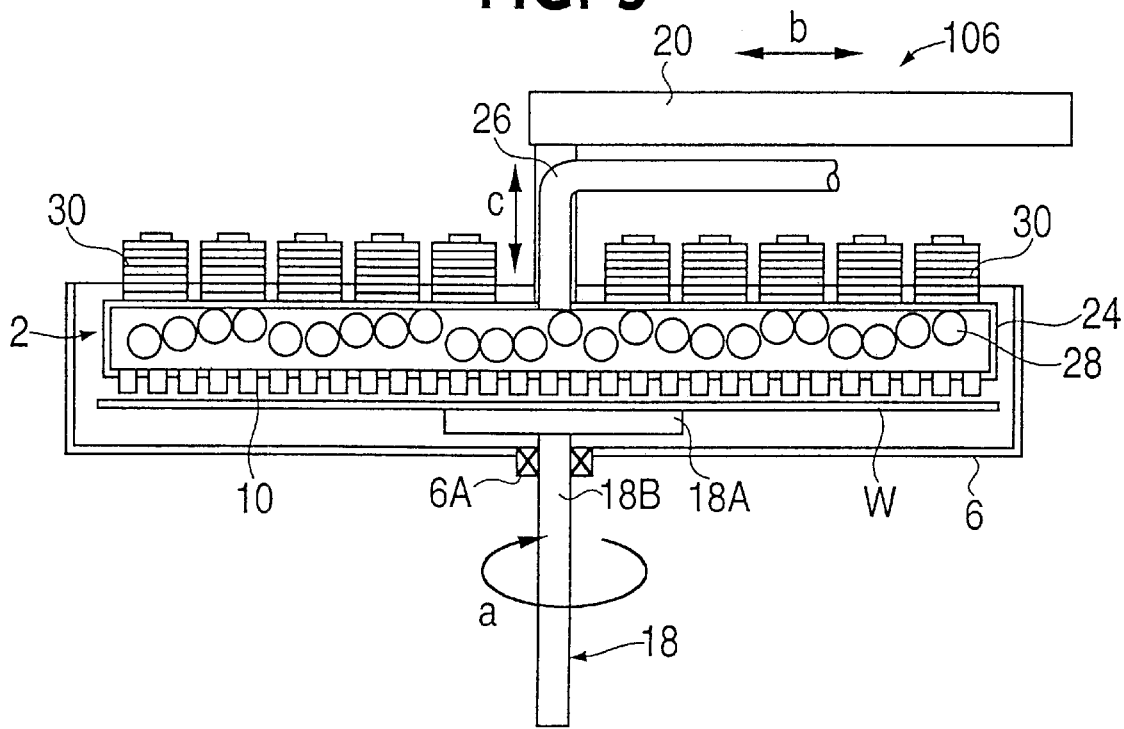

PHOTORESIST DEVELOPING NOZZLE, PHOTORESIST DEVELOPING APPARATUS, AND PHOTORESIST DEVELOPING METHOD

BACKGROUND OF THE INVENITON

1. Field of the Invention

The invention relates to a photoresist developing nozzle, a photoresist developing apparatus, and a photoresist developing method, more in detail, it relates to a photoresist developing nozzle, a photoresist developing apparatus, and a photoresist developing method for use in a lithography process in fabricating integrated circuits.

Particularly, the invention relates to a photoresist developing nozzle, a photoresist developing apparatus, and a photoresist developing method to be suitably used in fabricating integrated circuits employing a large diameter wafer.

2. Related Art

Integral circuits such as an IC, an LSI and a ULSI are ordinarily fabricated by photolithography.

An example of a photoresist developing apparatus which has been conventionally used in a developing process in the photolithography is shown in FIG. 14.

As shown in FIG. 14, a conventional photoresist developing apparatus comprises generally a photoresist developing nozzle A for discharging developer downward so as to put the developer on the surface of a wafer W to be developed, a turntable B which are disposed under the photoresist developing nozzle A so as to oppose the photoresist developing nozzle A for placing a wafer W thereon and turning it, and a developing cup C for preventing developer put on the wafer W from scattering toward the periphery of the wafer W.

The photoresist developing nozzle A comprises a columnar or pillar-shaped nozzle body A2 which is disposed horizontally and is hollow at the interior thereof, developer discharge sections A4 comprised of a plurality of sections arranged longitudinally and disposed at one face of the nozzle body A2 facing the turntable B for discharging developer downward, a developer supply pipe A6 disposed substantially at the center of the nozzle body A2 for supplying developer inside the nozzle body A2, and a nozzle transfer driving section A8 for moving the nozzle body A2 horizontally and vertically as depicted by the arrows b and c in FIG. 14, and holding the nozzle body A2 at a given position immediately over the wafer W placed on the turntable B during development. The nozzle body A2 has a length which is substantially the same as the diameter of the wafer W.

The photoresist developing apparatus is further provided with a rinse nozzle D for rinsing away the wafer W after discharging cleansing water on the wafer W after development. The rinse nozzle D is held at the position where it is avoided or moved away from the photoresist developing nozzle A and the wafer W so that it does not impede the motion of the photoresist developing nozzle A and so forth and is moved over the wafer W when rinsing away the wafer W.

However, since the discharging amount of developer discharged from the photoresist developing nozzle A is controlled by a supply pressure of developer in the developer supply pipe A6, it has been difficult to control the discharging amount and discharging pressure of developer with high accuracy across the entire length of the nozzle body A2.

Further, since the temperature of the developer supplied from the developer supply pipe A6 is normally lower than that of the interior of a clean room where the wafer W is developed, it increases as it directs from the central portion of the nozzle body A2 to the end portions thereof. Accordingly, the temperature of the developer discharged from the developer discharge sections A4 at the end portions of the nozzle body A2 is prone to be higher than that at the central portion of the nozzle body A2.

Since photoresist is easily molten as the temperature of the developer becomes high, the size of the resist pattern becomes small. For example, in the case of employment of a product called as WKR-PT-2 as a photoresist manufactured by Wako Junyaku Kogyo Kabushiki Kaisha and 2.38% water solution of tetramethyl ammonium hydroxide as a developer, an exposure is effected under the condition that the width of a resist pattern becomes 0.3 $\mu$m when the liquid temperature of the developer is 22° C., and development is effected at 24° C. instead of 22° C. As a result, the width of the resist pattern becomes small to an extent ranging from 0.27 to 0.28 $\mu$m.

As high degree of integrity has been recently required for integrated circuits, the integrated circuits have been fabricated in a design room of 0.15 $\mu$m, so that it has been more and more strongly required that variations in width of a resist pattern at positions between the central portion and the peripheral portion of the wafer are small.

Nevertheless, as the diameter of the wafer increases from 8 inch to 12 inch, it is necessary to use the long nozzle body A2 having a long length so that a temperature of the developer at the central portion of the nozzle body is largely different from that at the end portions thereof.

Accordingly, as the diameter of the wafer increases, there has arisen a serious problem that there occur frequently variations in a width of a resist pattern at the positions between the central portion of the wafer and the peripheral portion thereof such that a resist pattern at the central portion of the wafer becomes large and that at the periphery thereof becomes small.

Since spots where developer is not put on a wafer coated with photoresist which is prone to repel developer are liable to be produced, it is necessary to discharge developer as much as possible at the portion where the developer is liable to be repelled. Further, it is impossible to control the discharging amount of developer for every developer discharge section independently of each other, it has been necessary to increase the amount of supply of the developer from the developer supply pipe to prevent the production of spots where the developer is not put on the wafer.

Further, if the amount of supply of the developer from the developer supply pipe is increased, a large amount of develop is supplied to a spot where the developer is not repelled by photoresist, which causes the occurrence of another problem that the developer was wasted much.

SUMMARY OF THE INVENITON

It is therefore an object of the invention to provide a photoresist developing nozzle, a photoresist developing apparatus, and a photoresist developing method capable of effecting a uniform development with less waste of developer even if a large diameter wafer has been used.

To achieve the above object, it is a first aspect of the invention to provide a developer supply nozzle comprising a nozzle body having a plurality of small chambers inside thereof, developer supply channels for supplying developer to the respective small chambers, and developer discharge sections respectively provided in the small chambers to discharge developer supplied from the developer supply channels onto a wafer.

It is a second aspect of the invention to provide a photoresist developing method comprising the steps of moving a wafer horizontally, discharging developer from a plurality of developer discharge channels onto the wafer, while said developer discharge channels are arranged over a transfer surface of the wafer serving as a moving passage of the wafer, and discharging developer from a given number of developer discharge channels of a plurality of developer discharge channels to the wafer.

According to the photoresist developing method, the amount of developer to be discharged outside the wafer can be sharply reduced, and hence the amount of consumption of the developer can be economized.

It is a third aspect of the invention to provide a photoresist developing method comprising the steps of measuring a surface temperature of a wafer, discharging developer from a plurality of developer discharge channels onto the wafer, controlling discharging amount of developer for every channel of the plurality of developer discharge channels in response to the result of measurement of the surface temperature of the wafer.

According to these photoresist developing methods, it is possible to dispense with nonuniform development caused by affinity with developer on the surface of the wafer or variations in temperature on the surface of the wafer.

BRIEF DESCRIPTION OF THE DRAWINGS

FIG. 8 is a schematic sectional view showing an example of developer stirring means provided with stirring balls accommodated inside a nozzle body and electromagnets provided on the upper surface of the nozzle body in a photoresist developing apparatus according to a fourth embodiment of the invention;

FIG. 9 is a schematic sectional view showing the motion of stirring balls inside the nozzle body when a direct current is applied intermittently or pulsating current or an alternate current is applied to electromagnets provided in the photoresist developing apparatus in FIG. 8;

DESCRIPTION OF THE PREFERRED EMBODIMENTS

Figure 1:
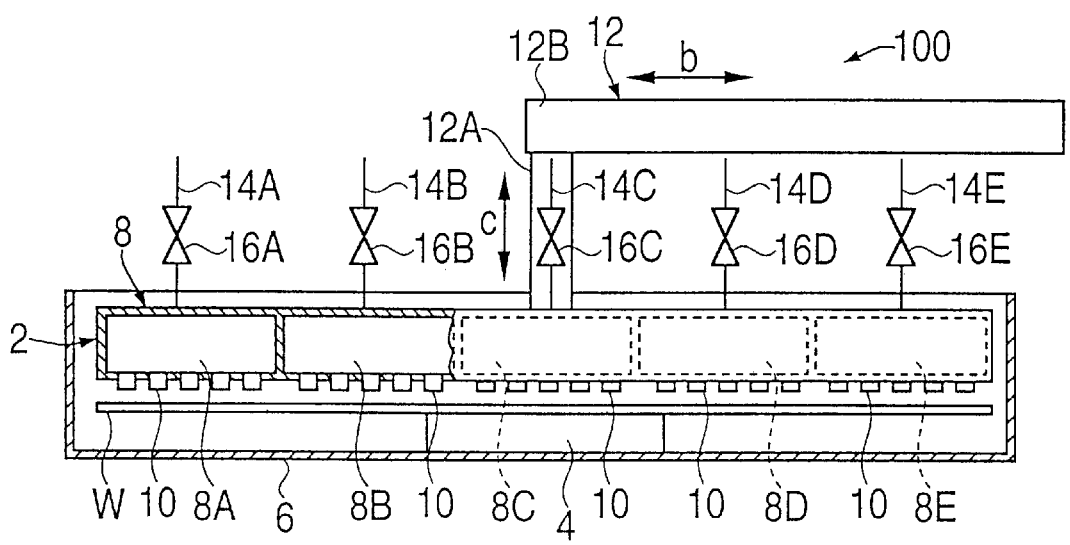
FIG. 1 is a schematic sectional view showing the construction of an example of a photoresist developing apparatus according to a first embodiment of the invention.
Figure 2:
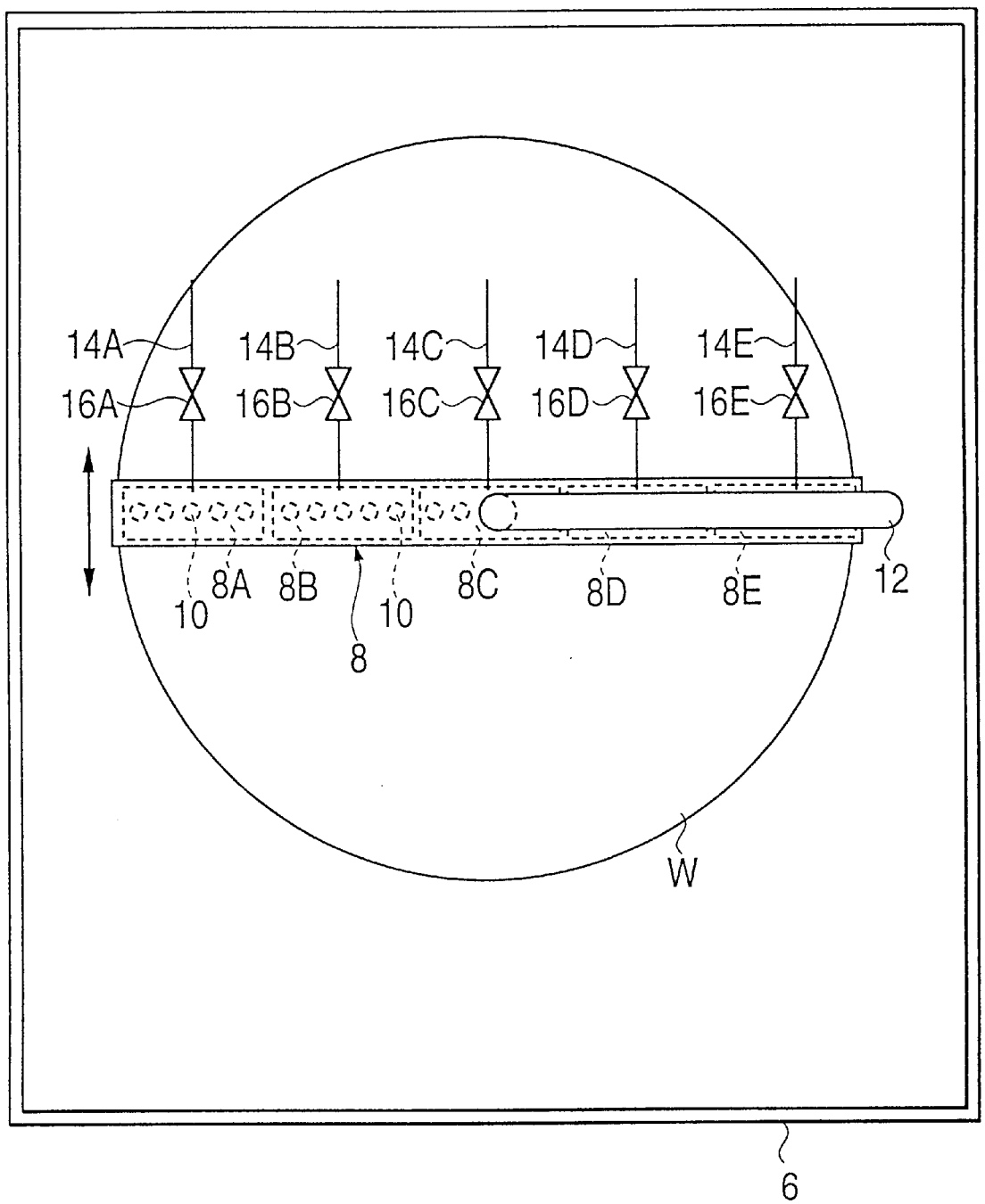
FIG. 2 is a plan view of the photoresist developing apparatus in FIG. 1 as viewed from the top thereof.

First Embodiment:

An example of a photoresist developing apparatus according to a first embodiment of the invention is now shown by FIG. 1 and a plan view of the same as viewed from the top thereof is shown by FIG. 2.

As shown by FIGS. 1 and 2, a photoresist developing apparatus 100 according to the first embodiment of the invention comprises a photoresist developing nozzle 2 for discharging developer downward to put it on the surface of a wafer W to be developed, a wafer chuck 4 for holding the wafer W at the lower portion of the photoresist developing nozzle 2 so as to face the photoresist developing nozzle 2, and a developing cup 6 for accommodating the wafer chuck 4 inside thereof and preventing developer put on the wafer W from being scattering toward the periphery.

The photoresist developing nozzle 2 is disposed horizontally as shown in FIGS. 1 and 2, and comprises a pillar-shaped nozzle body 8 which is hollow inside thereof, and a nozzle movement driving body 12 for holding the nozzle body 8 horizontally as shown in FIG. 1.

The nozzle body 8 may be square pillar-shaped or columnar as shown in FIGS. 1 and 2. The nozzle body 8 has a length substantially the same as the diameter of the wafer W, and the inside thereof is equally divided into 5 pieces of small chambers 8A, 8B, 8C, 8D and 8E. The number of small chambers formed inside the nozzle body 8 may be at least two, and preferably it may be at least three, and as the number of the small chambers increases, developer can be discharged in response to the surface condition of the wafer W and variations in temperature on the surface of the wafer W. All the small chambers do not always have the same size. Incidentally, only the small chambers 8A, 8B are shown by sectional views in FIG. 1.

Short cylindrical developer discharge sections 10 are formed on the lower surfaces of the small chambers 8A, 8B, 8C, 8D and 8E, namely, on the surfaces facing the wafer W during development along the longitudinal direction 5 by 5 for discharging the developer downward as shown in FIGS. 1 and 2. The number of the row along which the developer discharge sections 10 are arranged is not limited to one and the number of the developer discharge sections 10 per row is not limited to five.

Closable developer supply pipes 14A, 14B, 14C, 14D and 14E are provided in the small chambers 8A, 8B, 8C, 8D and 8E for supplying the developer. Closable valves 16A, 16B, 16C, 16D and 16E are provided in the closable developer supply pipes 14A, 14B, 14C, 14D and 14E. An electromagnet valve and a so-called air operable valve which is closable by air pressure are employed as the closable valves 16A, 16B, 16C, 16D and 16E. The closable developer supply pipes 14A, 14B, 14C, 14D and 14E may be provided with flow rate regulation valves instead of the closable valves 16A, 16B, 16C, 16D and 16E.

The nozzle movement driving body 12 is an inverted L-shaped arm member and comprises a vertical arm 12A extending vertically and a horizontal arm 12B extending horizontally from the upper end portion of the vertical arm 12A. The nozzle movement driving body 12 holds the nozzle body 8 at the position where it is avoided or moved away from the developing cup 6 except at the time during development, and also holds the nozzle body 8 in parallel with the wafer W over the wafer W at the time during development while moving the nozzle body 8 horizontally in the direction perpendicular to the longitudinal direction of the nozzle body 8 as shown by the arrows in FIG. 2.

As the wafer chuck 4, there is exemplified a vacuum chuck for generating negative pressure on the surface thereof to absorb and hold the wafer W.

The photoresist developing apparatus 100 is further provided with a rinse nozzle (not shown) for rinsing away the wafer W while discharging the wafer W after development. The rinse nozzle is held at the position where it is avoided or moved away from the developing cup 6 not to impede the motion of the photoresist developing nozzle 2 or the like during development and is moved over the wafer W when rinsing away the wafer W.

Figure 3:
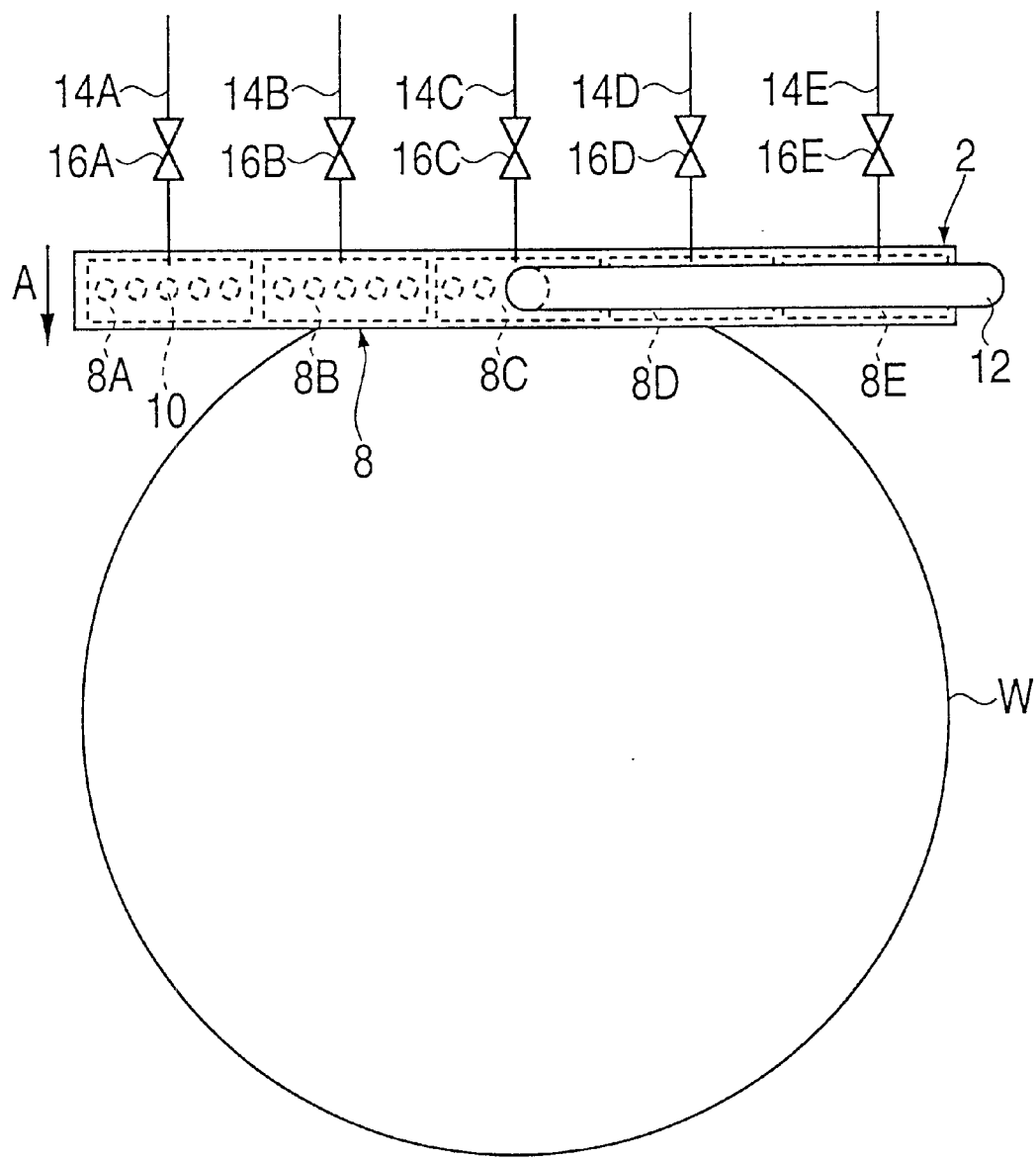
FIG. 3 is a plan view showing the positional relationship between a photoresist developing nozzle and a wafer when the photoresist developing nozzle is positioned over one of the peripheral edge portions of the wafer W in the photoresist developing apparatus in FIG. 1.
Figure 4:
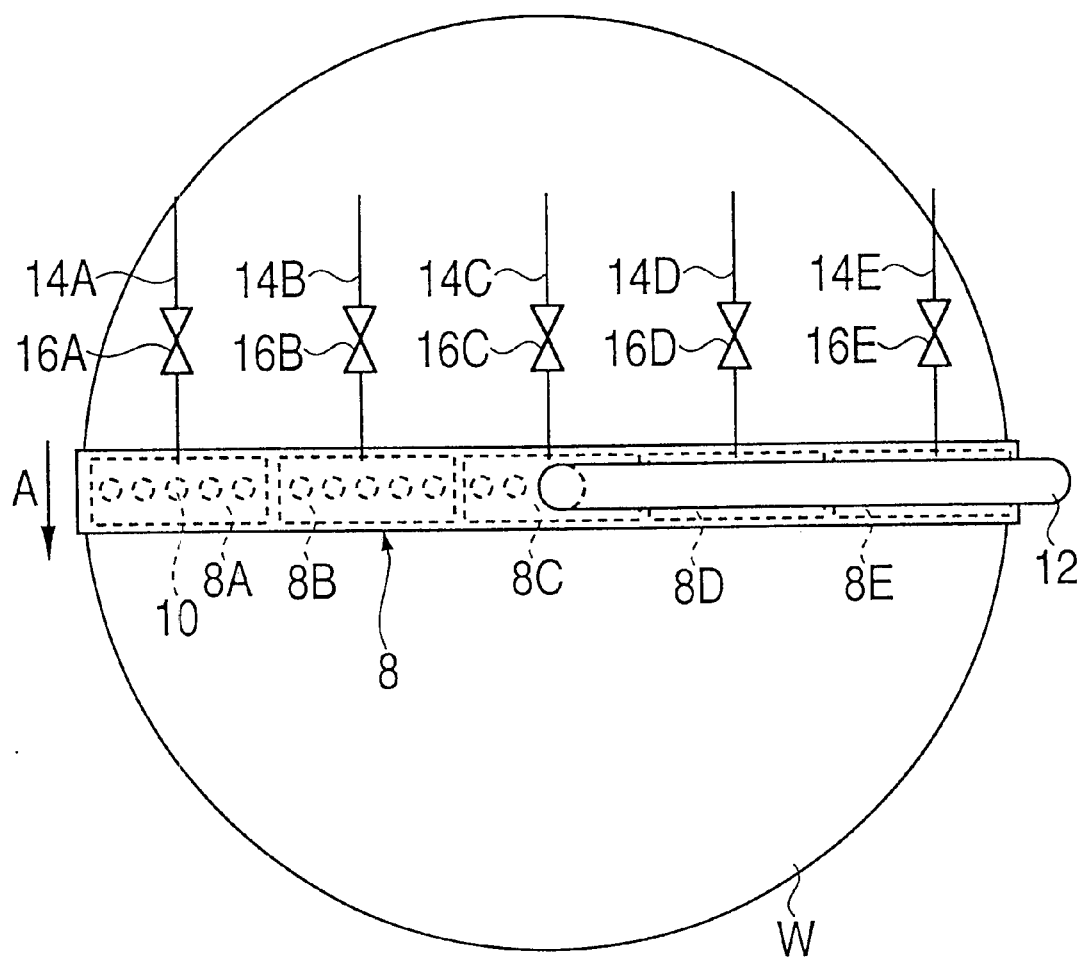
FIG. 4 is a plan view showing the positional relationship between a photoresist developing nozzle and a wafer when the photoresist developing nozzle is positioned over the central portion of the wafer W in the photoresist developing apparatus in FIG. 1.
Figure 5:
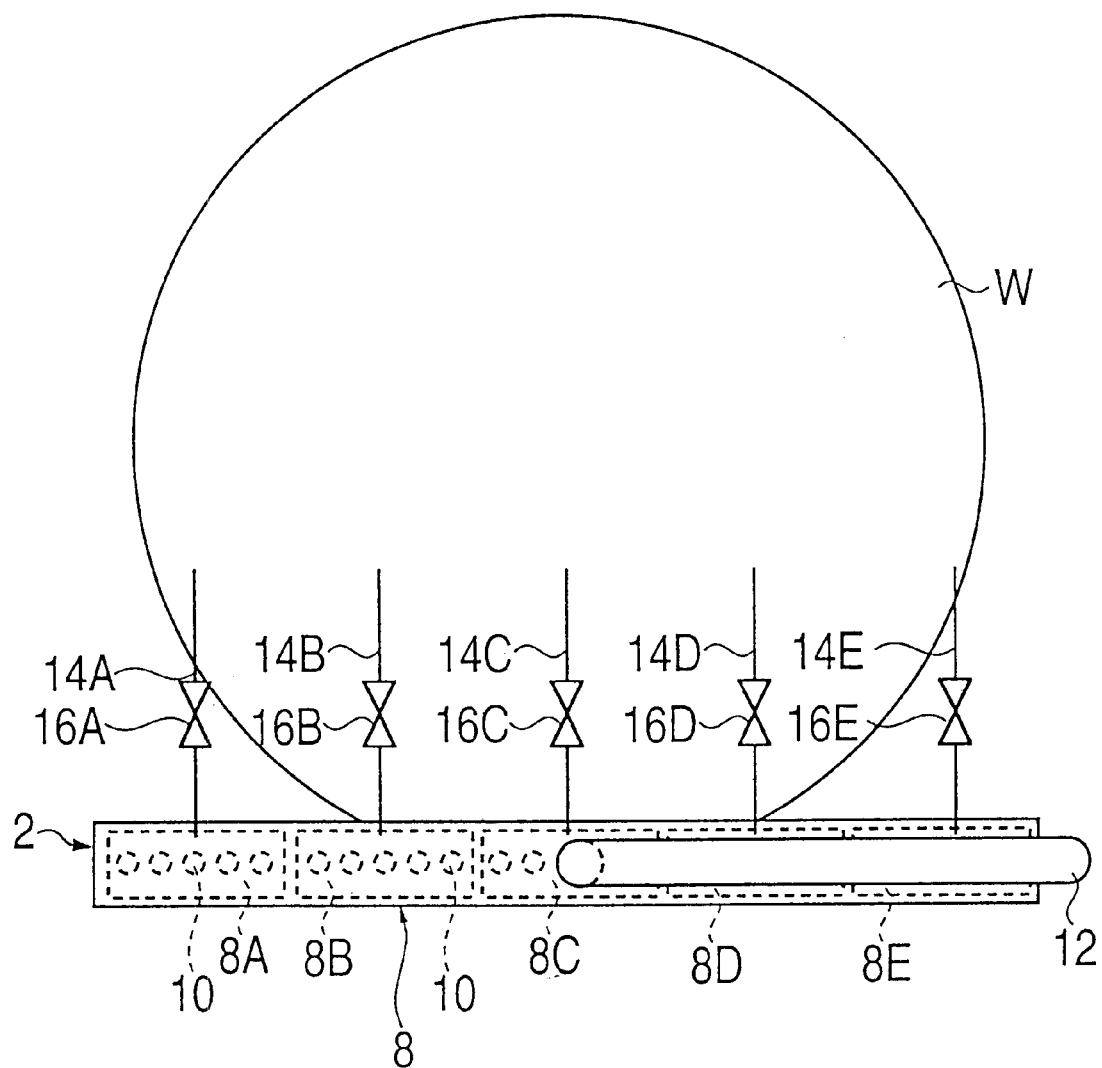
FIG. 5 is a plan view showing the positional relationship between a photoresist developing nozzle and a wafer when the photoresist developing nozzle is positioned over another peripheral edge portion of the wafer W in the photoresist developing apparatus in FIG. 1.

An example of a procedure for effecting development in a lithography process using the photoresist developing apparatus 100 is described with reference to FIGS. 3 to 5. FIGS. 3 to 5 show the photoresist developing nozzle 2 and the wafer W as viewed from the top thereof.

A positional relationship between the photoresist developing nozzle 2 and the wafer W when the photoresist developing nozzle 2 is positioned over one of the peripheral edge portions of the wafer W is shown in FIG. 3 and a positional relationship between the photoresist developing nozzle 2 and the wafer W when the photoresist developing nozzle 2 is positioned over the central portion of the wafer W is shown in FIG. 4. A positional relationship between the photoresist developing nozzle 2 and the wafer W when the photoresist developing nozzle 2 is positioned over another peripheral edge portion of the wafer W, i.e., a peripheral edge portion opposite to one peripheral edge portion in FIG. 3 is shown in FIG. 5.

The photoresist developing nozzle 2 is held in parallel with a surface of the wafer W coated with photoresist over one peripheral edge portion of the wafer W. As shown by the arrow A in FIGS. 3 to 5, the photoresist developing nozzle 2 is moved from the foregoing position in parallel with the surface coated with photoresist over one peripheral edge portion of the wafer W toward the central portion thereof in the direction perpendicular to the longitudinal direction of the nozzle body 8.

When the photoresist developing nozzle 2 is located at the position shown in FIG. 3, the wafer W passes only under the small chamber 8C positioned at the central portion of the nozzle body 8, and hence only the closable valve C of the closable valves 16A to 16E is opened so that developer is supplied to the small chamber 8C.

When the photoresist developing nozzle 2 is moved from the position shown in FIG. 3 to the central portion of the wafer W along the arrow A, the wafer W passes not only under the small chamber 8C but also under the small chambers 8B and 8D adjoining the small chamber 8C, the closable valves 16B to 16D are opened so that developer is supplied to the small chambers 8B to 8D.

When the photoresist developing nozzle 2 passes over the central portion of the wafer W as shown in FIG. 4, the wafer W passes under the entire small chambers 8A to 8E so that the closable valves 16A to 16E are opened so that developer is supplied to the entire small chambers 8A to 8E.

When the photoresist developing nozzle 2 is moved from the position shown in FIG. 4 to the position as shown by the arrow A to reach the position close to the opposite peripheral edge portion of the wafer W, the wafer W passes under only the small chambers 8B to 8D so that the closable valves 16A and 16E are closed, and hence developer is supplied only to the small chambers 8C to 8D.

When the photoresist developing nozzle 2 is further moved along the arrow A to the position shown in FIG. 5, the wafer W passes under only the small chamber 8C positioned at the central portion of the nozzle body 8, the closable valves 16A, 16B, 16C and 16D are closed, so that developer is supplied only to the small chamber 8C.

As mentioned above, with the photoresist developing apparatus 100, by opening or closing the closable valves 16A to 16E, presence of discharge of developer, discharging amount, and discharging pressure can be set for every chamber of small chambers 8A to 8E, in other words, presence of discharge of developer, discharging amount, and discharging pressure can be controlled along the longitudinal direction of the nozzle body 8. Accordingly, it is possible to discharge developer only to the wafer W by appropriately effecting control as set forth above, and hence the amount of developer to be discharged outside the wafer W can be sharply reduced, rendering wasted developer very small.

Further, since each length of the small chambers 8A to 8E is much shorter than that of the nozzle body 8 to the extent of substantially one fifth of the nozzle body 8, and developer is supplied to the small chambers 8A to 8E through the closable developer supply pipes 14A to 14E, even if the length of the nozzle body 8 increases, variations in temperature every developer discharge section 10 scarcely occur.

Figure 6:
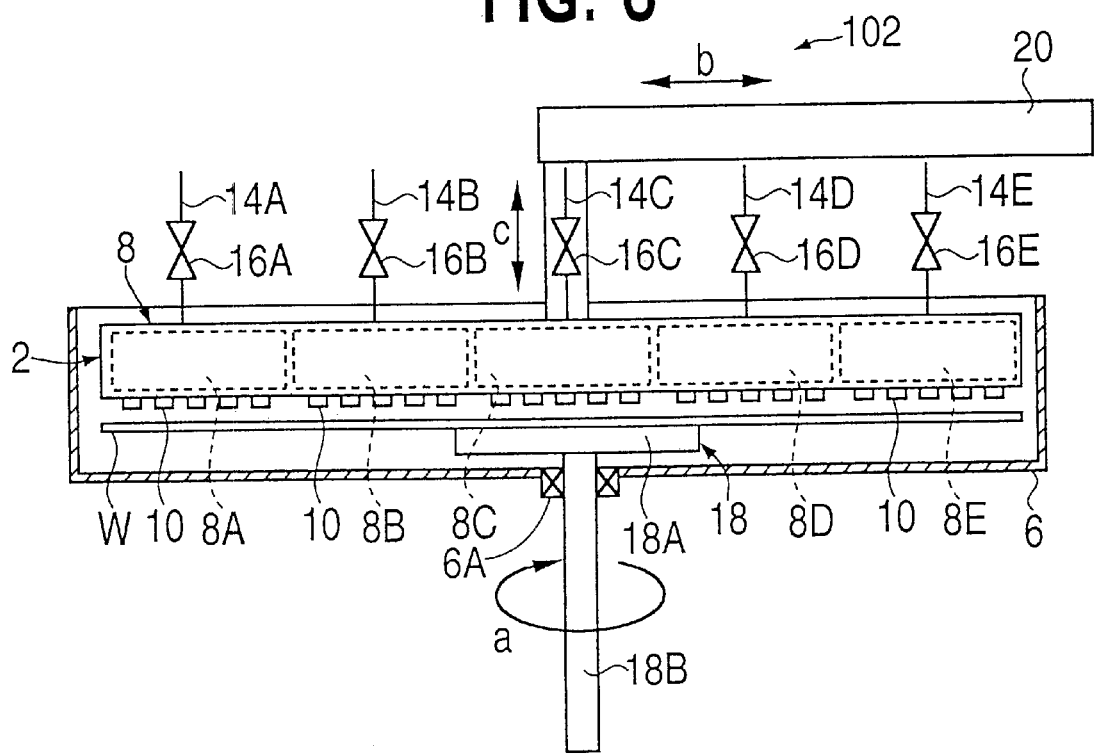
FIG. 6 is a schematic sectional view showing the construction of an example of a photoresist developing apparatus according to a second embodiment of the invention.

Second Embodiment (FIG. 6):

A photoresist developing apparatus according to a second embodiment of the invention is now described with reference to FIG. 6. In FIG. 6, the same reference numerals as those in FIGS. 1 to 5 show the same components as indicated by the reference numerals shown in FIGS. 1 to 5 except defined otherwise.

As shown in FIG. 6, in a photoresist developing apparatus 102, there is provided a turntable 18 under a photoresist developing nozzle 2 so as to face a nozzle body 8 for holding and turning a wafer W instead of the wafer chuck 4 in the photoresist developing apparatus 100 shown in FIG. 1 and 2.

The turntable 18 comprises a discoid wafer chuck 18A which is accommodated in a developing cup 6 and holds the wafer W, and a rotary shaft 18B which penetrates the bottom surface of the developing cup 6 to extend downward from the central portion of the lower surface of the discoid wafer chuck 18A. A bearing 6A is provided at the bottom surface of the developing cup 6 for rotatably holding the rotary shaft 18B of the turntable 18. In FIG. 6, an arrow a shows the rotating direction of the rotary shaft 18B.

In the photoresist developing nozzle 2, the nozzle body 8 is horizontally held by a photoresist developing nozzle holding arm 20. The photoresist developing nozzle holding arm 20 is an inverted L-shaped arm member for holding the nozzle body 8 at the position where it is moved away from the developing cup 6 except at the time during development and holding the nozzle body 8 in parallel with the wafer W over the wafer W as shown in FIG. 6 during development.

The photoresist developing apparatus 102 has the same nozzle body 8 as shown in FIG. 6 which is the same as that of the photoresist developing apparatus 100 as shown in FIGS. 1 and 2.

With the construction of the photoresist developing apparatus 102, presence of supply of developer, amount of supply of developer, and supply pressure can be controlled at every chamber of small chambers 8A to 8E like the photoresist developing apparatus 100 shown in FIGS. 1 and 2. Accordingly, for example, if the central portion of the surface of the wafer W is liable to repel developer, the discharging amount of developer from the small chamber 8C positioned at the central portion of the nozzle body 8 is increased while the discharging amount of developer from the small chambers 8A, 8B, 8D and 8E is decreased so as to effect a uniform development on the surface of the wafer W.

Even in cases where the temperature of the surface of the wafer W is not uniform, the supply of developer which is varied in liquid temperature for every chamber of the small chambers 8A to 8E renders a resist pattern formed on the surface of the wafer W uniform. For example, if the temperature of the central portion of the wafer W is high, developer which is low in liquid temperature is supplied to the small chamber 8C positioned over the central portion of the wafer W, and developer which is high in liquid temperature is supplied to the small chambers other than the small chamber 8C of the small chambers 8A to 8E, so that the wafer W can be uniformly developed.

Figure 7:
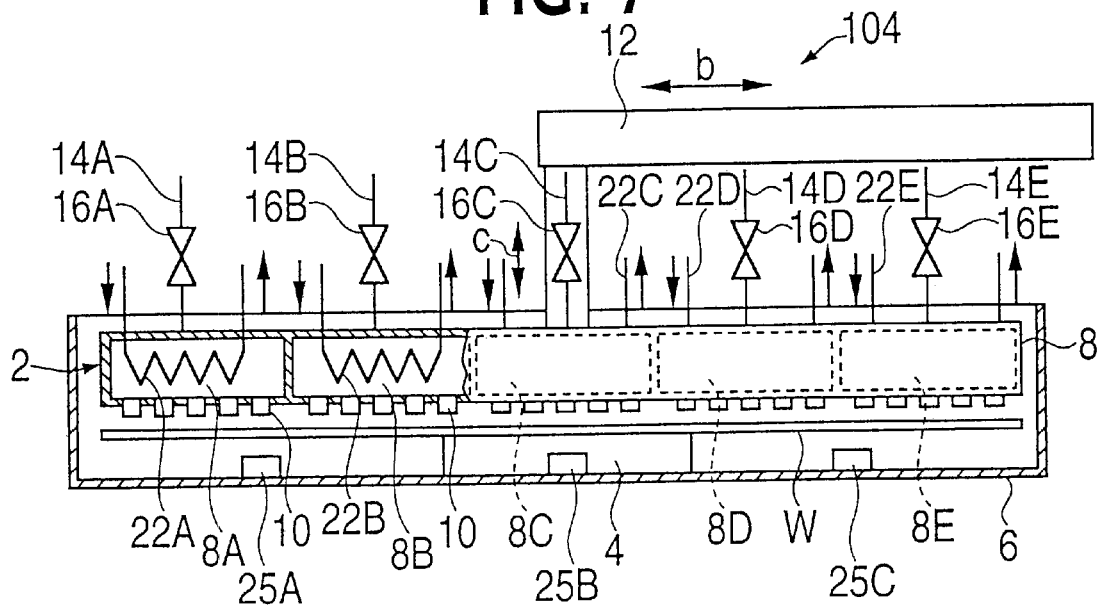
FIG. 7 is a schematic sectional view showing an example of addition of temperature regulating means for regulating liquid temperature of developer inside each small chamber of the nozzle body provided in a photoresist developing apparatus in FIGS. 1 and 2 according to a third embodiment of the invention.

Third Embodiment (FIG. 7):

An example of temperature regulation means for regulating a liquid temperature of developer provided inside respective small chambers of the nozzle body in the photoresist developing apparatus shown in FIGS. 1 and 2 according to a third embodiment of the invention is illustrated in FIG. 7. In FIG. 7, reference numerals which are the same as those as shown in FIGS. 1 to 5 indicate the same components given by the reference numerals FIGS. 1 to 5, except defined otherwise.

As shown in FIG. 7, with a photoresist developing apparatus 104, provided in respective small chambers 8A to 8E are temperature regulated water circulation conduits 22A to 22E serving as snake pipes through which water regulated to a predetermined temperature circulates. Incidentally, in FIG. 7, the inner sketches of the temperature regulated water circulation conduits 22C to 22E in the small chambers 8C to 8E are omitted. Heat medium other than water may be circulated through the temperature regulated water circulation conduits 22A to 22E.

The photoresist developing apparatus 104 has the same construction as the photoresist developing apparatus 100 shown in FIGS. 1 and 2 except the foregoing components.

Developer is discharged onto the surface of the wafer W while the photoresist developing nozzle 2 is moved in parallel with the surface of the wafer W and in the direction perpendicular to the longitudinal direction of the nozzle body 8, in the same manner as the photoresist developing apparatus 100 as shown in FIGS. 1 and 2. When the developer is supplied only to the small chamber under which the wafer W passes of the small chambers 8A to 8E as shown in FIGS. 3 to 5, the loss of developer caused by the discharge of developer outside the wafer W can be minimized.

With the photoresist developing apparatus 104, when the temperature of temperature regulated water which circulates through the temperature regulated water circulation conduits 22A to 22E is controlled, the temperature of the developer discharged through the developer discharge sections 10 can be controlled independently for every chamber of the small chambers 8A to 8E.

With the development according to the lithographic method, a resist pattern size varies largely even if the liquid temperature of developer varies even by 1 to 2° C. Further, if an area of the wafer W increases, nonuniformity of the temperature distribution of the wafer W within the area thereof becomes large.

"However, with the photoresist developing apparatus 104, not only the discharging amount and discharging pressure but also the temperatures of developer to be discharged can be controlled independently for every chamber of the small chambers 8A to 8E. Accordingly, in a chamber of the small chambers 8A to 8E for discharging developer to the low temperature portion of the wafer W as measured by temperature sensors 25A–25C, the temperature of temperature regulated water is made high so that high temperature developer can be discharged while the temperature of temperature regulated water is made low in chambers other than the foregoing chamber so that low temperature developer can be discharged, and hence a temperature of temperature regulated water is controlled. Since a temperature of the developer becomes high, photoresist is prone to be soluble, a solving speed becomes high at the portion where the temperature of the wafer W is low while solving speed becomes low at the portion where the temperature of the wafer W is high. As a result, development can be uniformly effected on the entire surface of the wafer W."

For example, in cases where the temperature at the central portion of the wafer W is higher than that at the peripheral edge portion, if the developer having the same liquid temperature is discharged onto the entire surface of the wafer W, development at the central portion of the wafer W is advanced more quickly than the peripheral edge portion, a resist pattern size at the central portion becomes smaller than that at the peripheral edge portion.

On the other hand, with the photoresist developing apparatus 104, when the central portion of the wafer W passes under the small chamber 8C positioned at the central portion of the nozzle body 8, the temperature of the temperature regulated water which circulates through the temperature regulated water circulation conduit 22C is decreased to cool the developer inside the small chamber 8C, then when the central portion of the wafer W passes under the small chamber 8C, the temperature of the temperature regulated water is increased to be returned to an original temperature, thereby preventing the excessive advancement of development at the central portion of the wafer W. As a result, it is possible to prevent the occurrence of difference in a resist pattern size at positions between the central portion of the wafer W and the peripheral edge portion thereof so that the wafer W can be uniformly developed.

Fourth Embodiment (FIG. 8):

An example of developer stirring means provided inside a nozzle body in a photoresist developing apparatus according to a fourth embodiment of the invention is illustrated in FIG. 8. In FIG. 8, reference numerals which are the same as those as shown in FIG. 6 indicate the same components given by the reference numerals FIG. 6.

As shown in FIG. 8, with a photoresist developing apparatus 106 according to the fourth embodiment of the invention, a photoresist developing nozzle 2 comprises a square pillar-shaped nozzle body 24 having a hollow inner portion and substantially the same diameter as a wafer W, a developer supply pipe 26 disposed substantially at the center of the nozzle body 24 for supplying developer inside the nozzle body 24, and a photoresist developing nozzle holding arm 20 for holding the nozzle body 24 horizontally in a given interval from the wafer W placed on a turntable 18 during development. The nozzle body 24 may be columnar in shape.

There are formed a plurality of developer discharge sections 10 on the surface facing the turntable 18, namely, on the lower surface of the nozzle body 24 in FIG. 8 for discharging and putting the developer onto the wafer W, and the developer discharge sections 10 are arranged along the longitudinal direction of the nozzle body 24.

Many stirring balls 28 are accommodated inside the nozzle body 24 wherein each stirring ball 28 has a size larger than the pore diameter of each developer discharge section 10. As the stirring balls 28, there are employed balls made of ordinary steel, strongly magnetized body such as ferrite, or the like. It is preferable that the diameter of each stirring ball 28 ranges from heat radiating section 3 to 5 mm, and the surface of each stirring ball 28 is coated with fluorocarbon resin, and so forth.

Electromagnets 30 are arranged on the upper surface of the nozzle body 24, namely, on the surface opposite to the surface where the developer discharge sections 10 are disposed, at one row in the longitudinal direction of the nozzle body 24. Each core of the electromagnet 30 is disposed perpendicularly relative to the upper surface of the nozzle body 24. A direct current is applied intermittently to the electromagnets 30, or a pulsating current or an alternate current is applied to the electromagnets 30.

A state where a direct current is applied intermittently to the electromagnets 30, or a pulsating current or an alternate current is applied to the electromagnets 30 is shown in FIG. 9. Since an intermittent magnetic field is formed vertically inside the nozzle body 24 by the electromagnets 30, the stirring balls 28 are attracted by the electromagnets 30 inside the nozzle body 24 to move upward, or they are deprived of electromagnetic force from the electromagnets 30 to move downward as shown in FIG. 9.

Accordingly, when a pulsating current or an alternate current is applied to the electromagnets 30 while developer is supplied to the inside of the nozzle body 24 from the developer supply pipe 26, the developer is stirred vertically inside the nozzle body 24. As a result, there does not occur variations in liquid temperature and composition of the developer inside the nozzle body 24, so that all the developer discharge sections 10 discharge the developer having the same liquid temperature and composition, thereby preventing nonuniform development caused by variations in liquid temperature and composition even in cases where a large diameter wafer W is developed by use of the long nozzle body 24.

Figure 10:
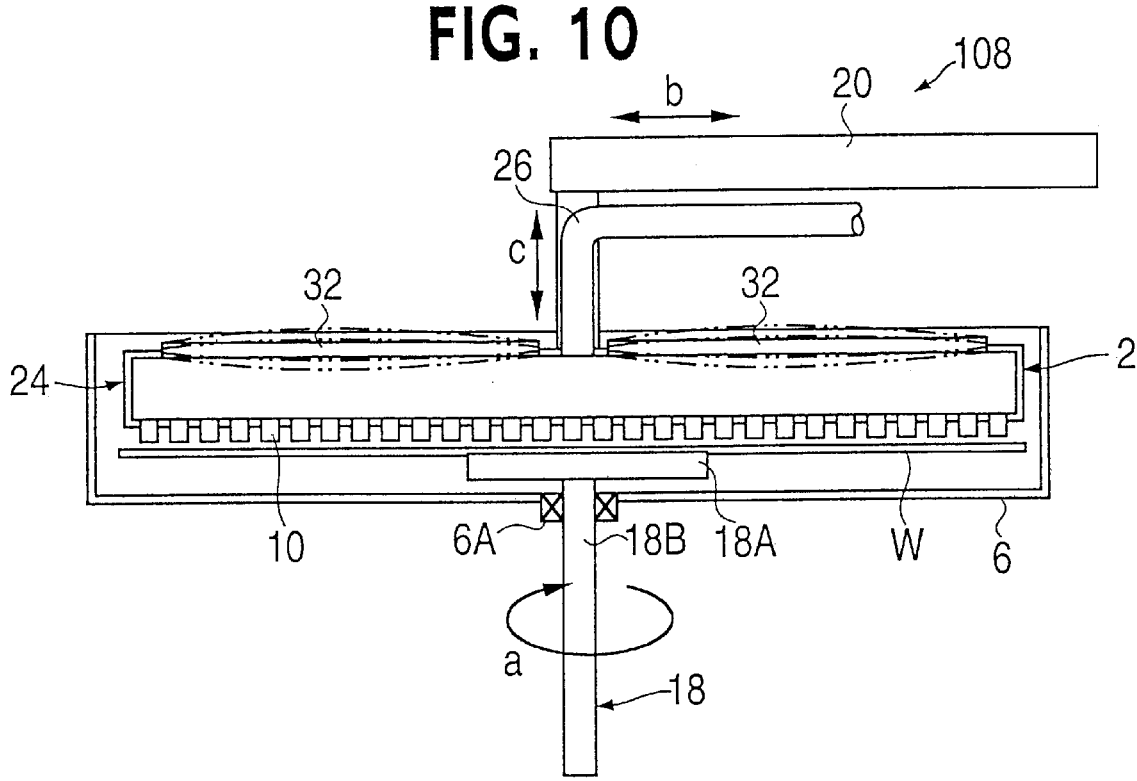
FIG. 10 is a schematic sectional view showing the construction of an example of electrostrictive members as developer stirring means inside a nozzle body of a photoresist developing apparatus according to a fifth embodiment of the invention.

Fifth Embodiment (FIG. 10):

An example of developer stirring means provided in a nozzle body of a photoresist developing apparatus according to a fifth embodiment of the invention is illustrated in FIG. 10. In FIG. 10, reference numerals which are the same as those as shown in FIGS. 8 and 9 indicate the same components given by the reference numerals FIGS. 8 and 9, except defined otherwise.

As shown in FIG. 10, a photoresist developing apparatus 108 according to the fifth embodiment of the invention has neither stirring balls nor electromagnets, but has plate-shaped electrostrictive members 32, instead provided on a part of the upper surface of a nozzle body 24.

The electrostrictive members 32 are oscillated in a thickness direction when an alternate current is applied thereto as shown by two dotted chain line in FIG. 10, in other words, they are oscillated toward the surface where developer discharge sections 10 of nozzle body 24 are provided, i.e. in the direction moving toward the lower surface, or in the direction moving away from the lower surface.

Accordingly, with the photoresist developing apparatus 108, when an alternate current is applied to the electrostrictive members 32 while the developer is supplied to the inside of the nozzle body 24 through the developer supply pipe 26, the developer is stirred vertically inside the nozzle body 24 like the case of the photoresist developing apparatus 104 shown in FIGS. 8 and 9. As a result, there does not occur variations in liquid temperature and composition of the developer inside a nozzle body 24, thereby preventing nonuniform development on the wafer W caused by variations in liquid temperature and composition even in the case of long nozzle body 24.

Further, since the photoresist developing apparatus 108 is simple in construction compared with the photoresist developing apparatus 104 shown in FIGS. 8 and 9 and hard ball bodies such as stirring balls do not strike against the inner wall of the nozzle body, which is different from the photoresist developing apparatus 104, and hence the photoresist developing apparatus 108 has a feature to operate more silently.

Figure 11:
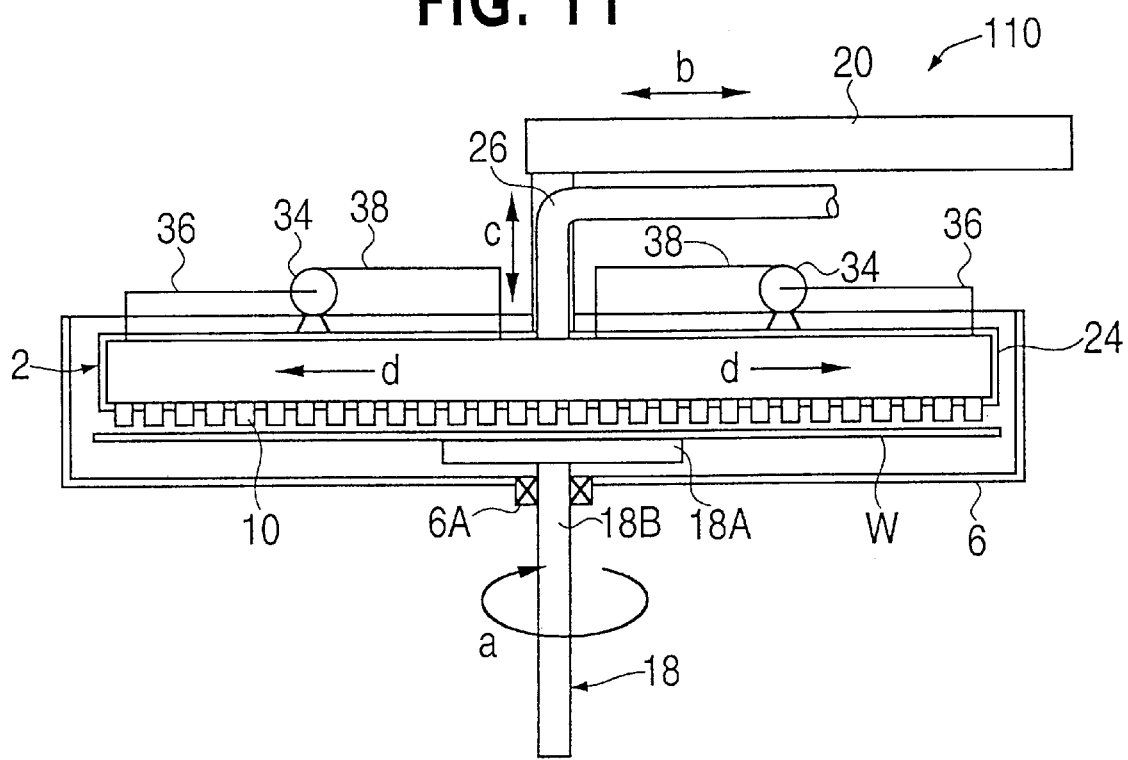
FIG. 11 is a schematic sectional view showing the construction of an example of developer current forming pumps as developer stirring means inside a nozzle body of a photoresist developing apparatus according to a sixth embodiment of the invention.

Sixth Embodiment (FIG. 11):

Another example of developer stirring means provided in a nozzle body of a photoresist developing apparatus 110 according to a sixth embodiment of the invention is illustrated in FIG. 11. In FIG. 11, reference numerals which are the same as those as shown in FIGS. 8 and 9 indicate the same components given by the reference numerals FIGS. 8 and 9.

As shown in FIG. 11, with a photoresist developing apparatus 110 according to the sixth embodiment of the invention, there are provided a pairs of developer current forming pumps 34 on the upper surface of a nozzle body 24 while intervening a developer supply pipe 26. Both end portions of the nozzle body 24 and suction ports of the developer current forming pumps 34 are connected to one another by developer suction conduits 36 while discharge ports of the developer current forming pumps 34 and the central portion of the nozzle body nozzle body 24, namely, a portion adjacent to the developer supply pipe 26 are connected to developer supply conduits 38.

An ordinary centrifugal pump is used as developer current forming pumps 34.

With the photoresist developing apparatus 110, when the developer current forming pumps 34 are driven in a state where the inside of the nozzle body 24 is filled with the developer supplied through the developer supply pipe 26, the developer inside the nozzle body 24 is sucked by the suction port of the developer current forming pumps 34 through the developer suction conduits 36 at the portions adjacent to the end portions of the nozzle body 24, the developer is discharged from the discharge ports of the developer current forming pumps 34 to the central portion of the nozzle body 24 through the developer supply conduits 38.

Accordingly, since the flows of developer are formed inside the nozzle body 24 in the direction from the central portion to the end portions of the nozzle body 24 as depicted by the arrows d in FIG. 11, temperature and composition of the developer is rendered uniform inside the nozzle body 24.

Accordingly, nonuniform development of the wafer W caused by variations in temperature and composition of the developer discharged from the photoresist developing nozzle 2 is solved.

Figure 12:
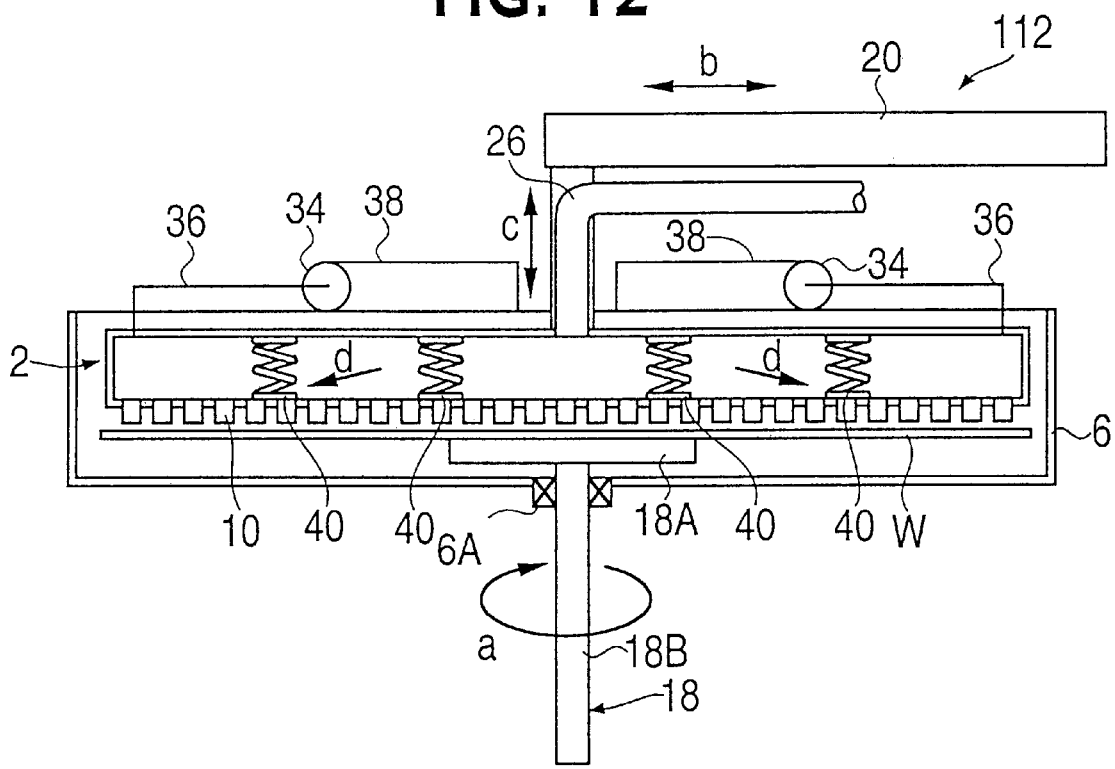
FIG. 12 is a schematic sectional view showing the construction of an example of swirling forming blades provided on the inner wall surface of a nozzle body of a photoresist developing apparatus shown in FIG. 11 according to a seventh embodiment of the invention.

Seventh Embodiment (FIG. 12):

An example of stirring blades provided on the inner wall surface of a nozzle body 24 in a photoresist developing apparatus according to a seventh embodiment of the invention is illustrated in FIG. 12. In FIG. 12, reference numerals which are the same as those in FIG. 11 indicate the same components as those shown in FIG. 11.

As shown in FIG. 12, with a photoresist developing apparatus 112 according to the seventh embodiment of the invention, a pair of swirling current forming blades 40 are provided upright on the inner wall of the nozzle body 24 between the openings of developer suction conduits 36 and developer supply conduits 38.

The swirling current forming blades 40 are formed upright so that flows of developer are formed clockwise in the direction directing from the central portion of the nozzle body 24 to the end portions thereof. Inside the nozzle body 24, the flows d of the developer formed by developer current forming pumps 34 are changed to swirling currents upon reception of a force to turn clockwise to from the swirling current forming blades 40.

Accordingly, since the developer is well stirred inside the nozzle body 24, nonuniform development of the wafer W caused by variations in temperature and composition of developer discharged from a photoresist developing nozzle 2 can be more effectively prevented.

Figure 13:
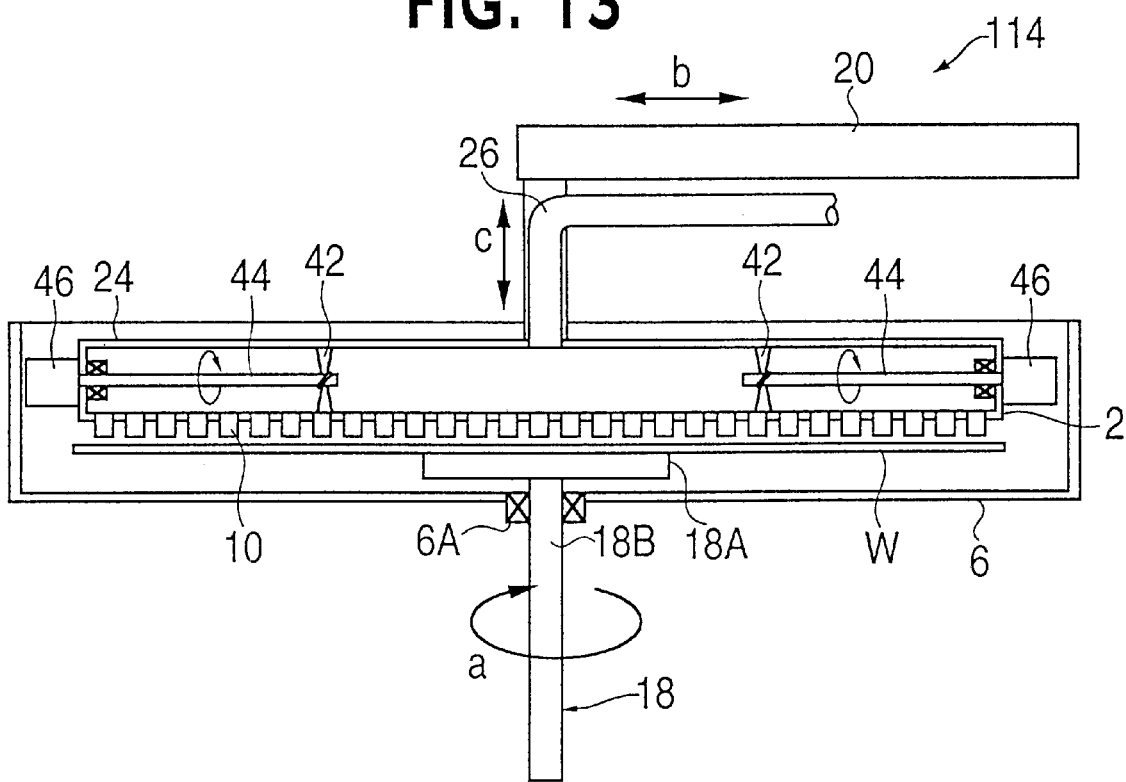
FIG. 13 is a schematic sectional view showing the construction of an example of stirring propellers as developer stirring means inside a nozzle body of a photoresist developing apparatus according to an eighth embodiment of the invention.
Figure 14:
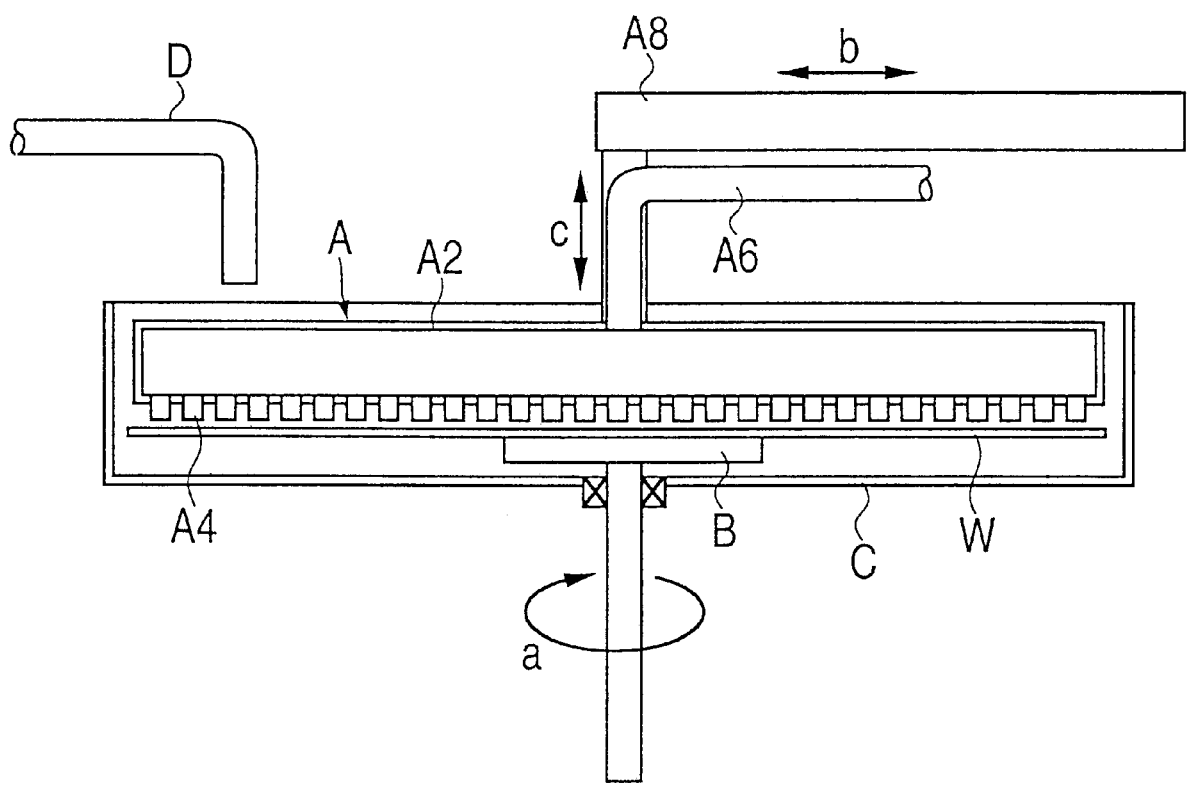
FIG. 14 screw shaft is a schematic sectional view of the construction of a conventional photoresist developing apparatus.

Eighth Embodiment (FIG. 13):

Still another example of stirring blades provided on the inner wall surface of a nozzle body in a photoresist developing apparatus according to an eighth embodiment of the invention is illustrated in FIG. 13. In FIG. 13, reference numerals which are the same as those in FIGS. 8 and 9 indicate the same components given by the reference numerals FIGS. 8 and 9.

As shown in FIG. 13, with a photoresist developing apparatus 114 according to the eighth embodiment of the invention, there are provided a pair of stirring propellers 42 inside a nozzle body 24.

The stirring propellers 42 extend from the end faces of the nozzle body 24 toward the central portion thereof and they are fixed to rotary shafts 44 provided rotatably on the end faces of the nozzle body 24. The rotary shafts 44 are rotated by motors 46.

With the photoresist developing apparatus 114, when the stirring propellers 42 are rotated by the motors 46, developer supplied through a developer supply pipe 26 is stirred by the stirring propellers 42 inside the nozzle body 24, thereby forming swirling currents. The liquid temperature and composition of the developer are rendered uniform by the swirling currents. Accordingly, nonuniform development of a wafer W caused by variations in temperature and composition of the developer discharged from a photoresist developing nozzle 2 are effectively prevented.

Further, since the strength of the swirling currents inside the nozzle body 24 can be varied by changing the rotating speed of the stirring propellers 42, the strength of the swirling currents can be adjusted in response to the liquid temperature and composition of the developer supplied through a developer supply pipe 26.

For example, in cases where the diameter of the wafer W is large and the length of the nozzle body 24 is long, and the temperature of the developer is remarkably lower or higher than the temperature in a clean room where the photoresist developing apparatus 114 is installed, the rotating speed of the stirring propellers 42 are increased to render the swirling currents strong, thereby solving the problem of nonuniformity of development of a wafer W caused by variations in temperature and composition of the developer discharged from the photoresist developing nozzle 2.

As mentioned in detail above, according to the invention, it is possible to provide a photoresist developing nozzle, a photoresist developing apparatus, and a photoresist developing method capable of effecting uniform development even in even in the case of a large diameter wafer.

What is claimed is:

1. A developer supply nozzle comprising:
   a nozzle body having a plurality of small chambers inside thereof;
   developer supply channels for supplying developer to the respective small chambers; and
   developer discharge sections respectively provided in the small chambers to discharge developer supplied from the developer supply channels onto a wafer,
   the small chambers having temperature regulation units therein that regulate temperature of the developer in the small chambers.

2. The developer supply nozzle according to claim 1, wherein the nozzle body is a hollow pillar-shaped body which is disposed in parallel with the wafer during development, and the small chambers are formed by partitioning an inner space of the nozzle body in the longitudinal direction thereof.

3. The developer supply nozzle according to claim 1, wherein the developer supply channels are formed to be openable or closable.

4. The developer supply nozzle according to claim 1, wherein the developer supply channels are formed such that flow rate of developer can be regulated.

5. A developer supply nozzle comprising:
   a nozzle body through which developer circulates;
   developer supply conduits for supplying developer onto the nozzle body;
   developer discharge sections provided in the nozzle body for discharging developer supplied from the developer supply conduits onto a wafer; and
   stirring sections for stirring developer inside the nozzle body.

6. The developer supply nozzle according to claim 5, wherein the stirring sections comprises:
   stirring balls accommodated inside the nozzle body and having magnetism; and
   electromagnets provided outside the nozzle body for rendering the stirring balls to float inside the nozzle body.

7. A photoresist developing method comprising:

measuring a surface temperature of a wafer;

controlling temperature of a developer in a plurality of developer discharge channels, in response to said measuring a surface temperature of the wafer; and discharging the temperature controlled developer from the developer discharge channels onto the wafer, while the developer discharge channels are moved over a surface of the wafer, the developer being discharged beginning from central ones of the developer discharge channels and then from peripheral ones of the developer discharge channels, according to a relative location of the developer discharge channels with respect to the wafer.

8. The photoresist developing method according to claim 7, wherein the temperature of the developer is controlled such that developer of relatively lower temperature is discharged to an area of the wafer having a high surface temperature and developer of relatively higher temperature is discharged to areas of the wafer having a low surface temperature.

9. The photoresist developing method of claim 7, wherein the developer is discharged from a developer supply nozzle via the developer discharge channels, said discharging developer comprises discharging the developer from developer discharge channels located in a central area of the developer supply nozzle when the developer supply nozzle is moved to be at positions over peripheral areas of the wafer.

10. The photoresist developing method of claim 9, wherein said discharging developer comprises discharging the developer from all the developer discharge channels of the developer supply nozzle when the developer supply nozzle is moved to be at a position over a diameter of the water.

11. The photoresist developing method of claim 7, wherein said controlling temperature of a developer comprises independently controlling the developer in the developer discharge channels responsive to said measuring a surface temperature of a wafer.

12. A photoresist developing method comprising:

stirring developer inside a plurality of developer discharge channels; and discharging stirred developer from the developer discharge channels onto a wafer, while the developer discharge channels are moved over a surface of the wafer, the developer being discharged beginning from the central ones of the developer discharge channels and then from peripheral ones of the developer discharge channels, according to a relative location of the developer discharge channels with respect to the wafer.

* * * * *